United States Patent [19]
Uchiyama et al.

[11] Patent Number: 5,576,929
[45] Date of Patent: Nov. 19, 1996

[54] STRUCTURE HAVING A LATCH MECHANISM ENGAGING AN INTERMEDIATE COVER AND AN OUTER COVER AND LIFTING THE INTERMEDIATE COVER BY DEFORMATION OF ELASTIC MEMBER

[75] Inventors: Yoshiharu Uchiyama; Fusanobu Nakamura; Michio Suzuki; Tetsuya Ohtani, all of Kanagawa, Japan

[73] Assignee: International Buisness Machines Corporation, Armonk, N.Y.

[21] Appl. No.: 278,735

[22] Filed: Jul. 22, 1994

[30] Foreign Application Priority Data

Jul. 22, 1993 [JP] Japan ................... 5-181594

[51] Int. Cl.$^6$ ................ G06F 1/16; H05K 5/00
[52] U.S. Cl. .................. 361/680; 361/681; 292/63; 292/163; 292/341.17; 292/175; 292/DIG. 72; 312/291; 220/326; 220/256; 206/305; 190/109
[58] Field of Search ............... 292/63, 64, 128, 292/175, 163, DIG. 72, 341.17; 190/109, 111, 106, 119, 121, 900–902; 220/256, 326; 312/216, 326, 217, 223.2, 291; 364/708.1; 361/680–683

[56] References Cited

U.S. PATENT DOCUMENTS

| | | | |
|---|---|---|---|
| 2,091,651 | 8/1937 | Platt et al. | 190/109 X |
| 2,479,269 | 8/1949 | Schneider | 190/109 X |
| 5,400,213 | 3/1995 | Honda et al. | 361/680 |

*Primary Examiner*—Michael W. Phillips
*Attorney, Agent, or Firm*—Craig J. Yudell

[57] ABSTRACT

A latch mechanism which engages with a main body is provided at pivoting edges of a keyboard and a cover which are provided at the main body so as to be openable and closable. The latch mechanism includes a latch member which is movable from a first position, at which the cover and the keyboard are engaged with the main body, to a second position, at which the engaged state of the cover and the keyboard with the main body is released. The latch member releases only the engaged state of the main body and the cover at a third position which is between the first position and the second position. Further, the latch member is usually urged to the first position by a compression coil spring which deforms upwardly in a convex shape at the second position of the latch member.

9 Claims, 6 Drawing Sheets

STRUCTURE HAVING A LATCH MECHANISM ENGAGING AN INTERMEDIATE COVER AND AN OUTER COVER AND LIFTING THE INTERMEDIATE COVER BY DEFORMATION OF ELASTIC MEMBER

BACKGROUND OF THE INVENTION

1. Technical Field

The present invention relates to a structure having a cover, and in particular, to a structure having a cover which is applicable to a small computer or the like such as a notebook-type personal computer.

2. Description of the Related Art

In conventional structures having a cover, generally, a cover is disposed at a substantially box-shaped main body so as to pivot around an edge portion of the cover so as to be openable and closable. A compression coil spring which usually urges the cover in a direction of opening is interposed between the cover and the main body. In this type of structure having a cover, the main body and the cover are engaged by a latch mechanism which includes a latch member which can return to an original position.

When the latch member of this type of structure having a cover is released, the engaged state of the main body and the cover is released, and the cover is pivoted in the direction of opening due to the urging force of the compression coil spring.

As the uses of small computers, such as lap-top type personal computers, notebook-type personal computers, and the like, have diversified, the need to expand various functions of such computers has increased. In light of these circumstances, various structures have been proposed. Japanese Utility Model Application Laid-Open No. 3-54027 discloses "a personal computer equipped with: a keyboard provided so as to be freely attachable to and removable from a device main body; and an expansion unit mounting mechanism which is provided so as to be exposed at an open surface of a keyboard mounting portion of the device main body". Japanese Utility Model Application Laid-Open No. 4-36623 discloses "a display-integrated-type computer in which a keyboard is mounted to a main body so as to be freely openable and closable, the display-integrated-type computer having a connector to which an option board is connected and which is provided in a board mounting space which is formed under the keyboard."

In conventional structures having a cover, in addition to the various parts forming the latch mechanism, there is also a need for a compression coil spring to push up the cover, which leads to a drawback in that space is required for the various parts. Further, when a structure similar to these structures having a cover is used in a small electronic device such as a notebook-type personal computer or the like, difficulties arise with respect to weight and size.

Because the personal computer disclosed in above-mentioned Japanese Utility Model Application Laid-Open No. 3-54027 is structured such that the keyboard is freely attachable to and removable from the device main body, the mounting and removing operations are troublesome. Further, in addition to providing a latch mechanism for the cover (with which the display is integrally provided) and the main body, there is also the need to provide a latch mechanism for the keyboard and the main body, which is unsatisfactory with respect to the number of parts and space required.

Moreover, in the display-integrated computer disclosed in Japanese Utility Model Application Laid-Open No. 4-36623, the keyboard can be opened by a pivoting operation by merely releasing the latch mechanism. Therefore, this structure is relatively satisfactory with respect to workability. However, in addition to providing a latch mechanism for the cover (with which the display is integrally provided) and the main body, it is also necessary to provide a latch mechanism for the keyboard and the main body. This structure is therefore unsatisfactory with respect to the number of parts and space required.

The present invention was developed in light of the above, and the object thereof is to provide a structure having a cover in which the number of parts can be reduced and space can be utilized efficiently without deteriorating workability during the opening and closing operations.

SUMMARY OF THE INVENTION

According to the present invention, a structure is provided having a main body, and a cover which is provided at the main body so as to pivot around an edge portion of the cover so as to be openable and closable. The cover comprising an engaging member movable between an engaging position, at which the engaging member engages the cover to the main body, and a releasing position, at which an engaged state of the cover and the main body is released; and an elastic member usually urging the engaging member from the releasing position toward the engaging position, and deforming in accordance with movement of the engaging member so as to urge the cover in an opening direction when the engaging member moves to the releasing position.

By merely moving the engaging member from the engaged position to the released position against the urging force of the elastic member, the cover is urged by the elastic member so as to pivot in the direction of opening, and the cover is opened. Further, when the external force applied to the engaging member is released, the engaging member returns from the released position to the engaged position due to the urging force of the elastic member. Therefore, when the cover is shut, a region of the cover which is closer to the pivoted edge than to the center of pivoting engages with the main body due to the engaging member. Accordingly, there is no need for a compression coil spring or the like to continually urge the cover in the opening direction, and the number of parts and the necessary space can be reduced. Further, the workability during opening and closing of the cover is good.

Another embodiment comprises a structure having a main body, a cover, and an intermediate cover. The cover being provided at the main body so as to pivot around an end portion of the cover so as to be openable and closable, and the intermediate cover being provided at the main body so as to pivot around an end portion of the intermediate cover so as to be openable and closable. The cover comprising engaging means for engaging to the main body both a region of the cover, which is nearer to a pivoting edge of the cover than to a center of pivoting of the cover, and a region of the intermediate cover, which is nearer to a pivoting edge of the intermediate cover than to a center of pivoting of the intermediate cover.

The cover and the intermediate cover are mounted to the main body so as to be openable and closable with respective end portions thereof as centers of pivoting thereof. Respective regions of the cover and the intermediate cover which are closer to the pivoting edges than to the centers of pivoting engage with the main body. Accordingly, because there is no need to provide an engaging means for the cover separately from an engaging means for the intermediate cover, the number of parts and the necessary space can be reduced. Further, because the cover and the intermediate cover are mounted to the main body so as to be openable and closable with respective end portions thereof as centers of pivoting thereof, workability does not deteriorate.

Another feature provides the invention wherein the engaging means includes an engaging member provided at the main body, the engaging member being movable from a first position, at which the cover and the intermediate cover are engaged to the main body, to a second position, at which an engaged state of the cover and the intermediate cover to the main body is released, the engaging member releasing only an engaged state of the main body and the cover at a third position which is between the first position and the second position.

By moving the engaging member, which forms the engaging means, from the first position to the third position, the engaged state of the main body and the cover can be released while the intermediate cover and the main body remain engaged. Accordingly, if, for example, the present invention is applied to a small computer such as a notebook-type personal computer or the like, a keyboard which functions as an intermediate cover can remain engaged with the main body while only the cover (at which a display is provided) is opened and closed. Therefore, workability under ordinary conditions does not deteriorate.

On the other hand, when the engaging member which forms the engaging means is further moved from the third position to the second position, the engagement of the main body and the intermediate cover is released. Accordingly, when the present invention is applied to a small computer such as a notebook-type personal computer or the like, the keyboard which functions as an intermediate cover can be opened and closed while the cover is in an open state so that devices such as expansion boards, memories and the like for expanding functions can be freely attached and removed from the interior of the main body.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 10a and 10b are a sectional views substantially corresponding to a cross-section taken along line 10—10 of FIG. 9, and is used to explain operation of the latch mechanism.

DETAILED DESCRIPTION OF THE PREFERRED EMBODIMENT

Figure 1:
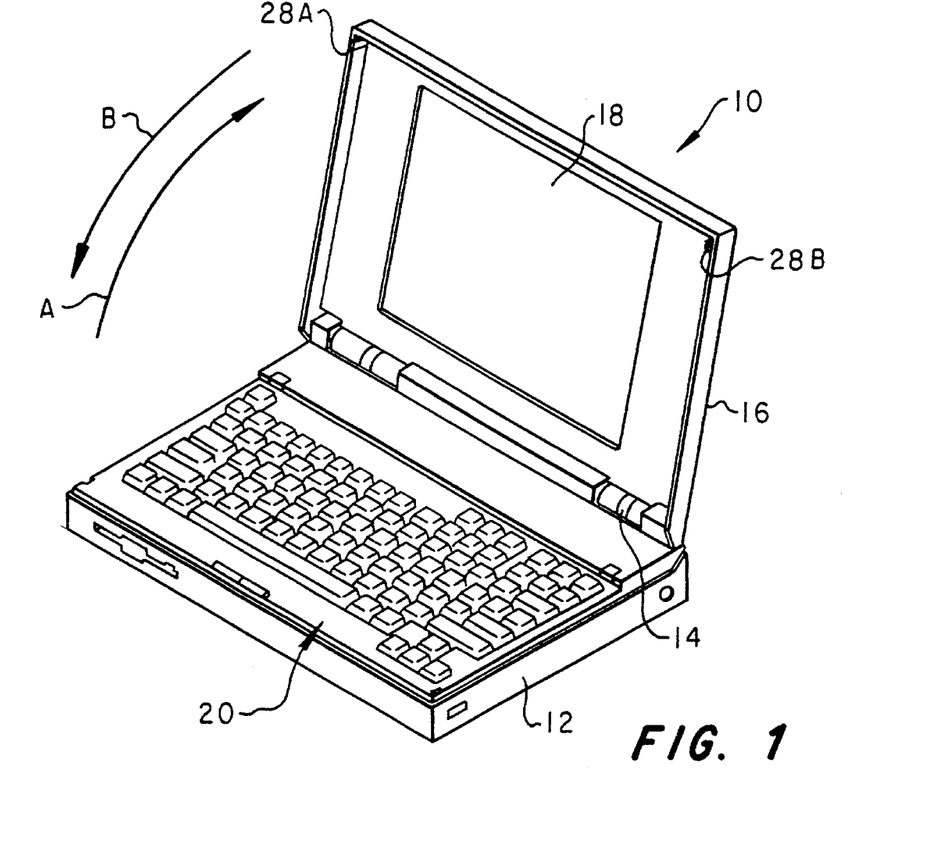
FIG. 1 is an external perspective view illustrating an open state of a cover of a notebook-type personal computer of an embodiment of a structure having a cover relating to the present invention.

In FIG. 1, a notebook-type personal computer 10 is illustrated as the structure having a cover to which the present invention is applied. The notebook-type personal computer 10 includes a main body 12 as well as a cover 16 which can be opened and closed. The cover 16 is mounted to the main body 12 via hinges 14, which are provided at one edge portion (the lower edge portion in FIG. 1) of the cover 16, so that the cover 16 is pivoted (in the directions of arrow A and arrow B in FIG. 1) around an unillustrated hinge shaft forming an axis of pivoting.

A rectangular LCD (liquid crystal display) panel 18 is provided at a portion of the cover 16 other than the upper, lower, left and right portions thereof.

Figure 2:
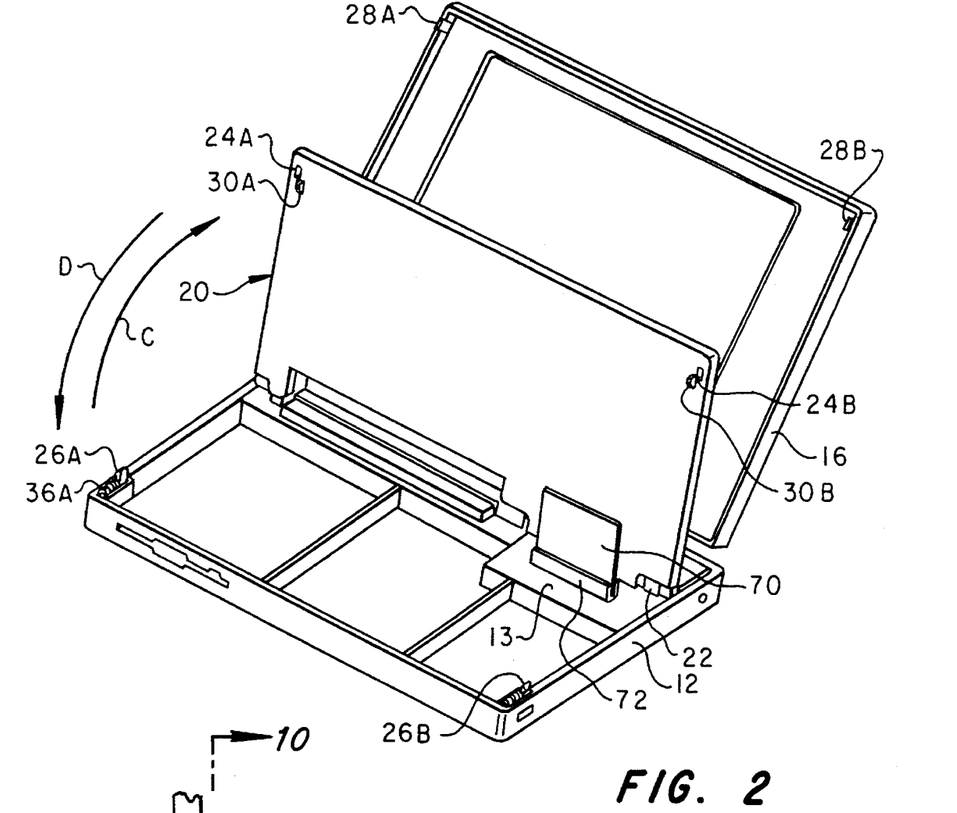
FIG. 2 is a schematic perspective view illustrating an open state of a keyboard of the notebook-type personal computer illustrated in FIG. 1.

A keyboard 20 serving as an intermediate cover is disposed at an upper portion of the main body 12. As illustrated in FIG. 2, one edge (the lower edge in FIG. 2) of the keyboard 20 is connected to the main body 12 via hinges 22, and pivots (see arrows C and D in FIG. 2) around an unillustrated hinge shaft forming an axis of pivoting so as to be able to be opened and closed.

A pair of rectangular through holes 24A, 24B are formed in the edges (the left and right edges in FIG. 2) of the underside of the keyboard 20 at the pivoting edge portion thereof. Latch members 26A, 26B forming a latch mechanism, which will be described later, are formed respectively at edges of the main body 12 so as to correspond to the through holes 24A, 24B. When the keyboard 20 is shut, the latch members 26A, 26B are inserted into the through holes 24A, 24B so that the keyboard 20 is completely closed. (This construction will be described in detail later.)

Engaging portions 28A, 28B which are engageable with the latch members 26A, 26B are provided at the edges of the cover 16 (the left and right edges in FIGS. 1 and 2) in a vicinity of the pivoting edge portion of the cover 16.

Figure 4:
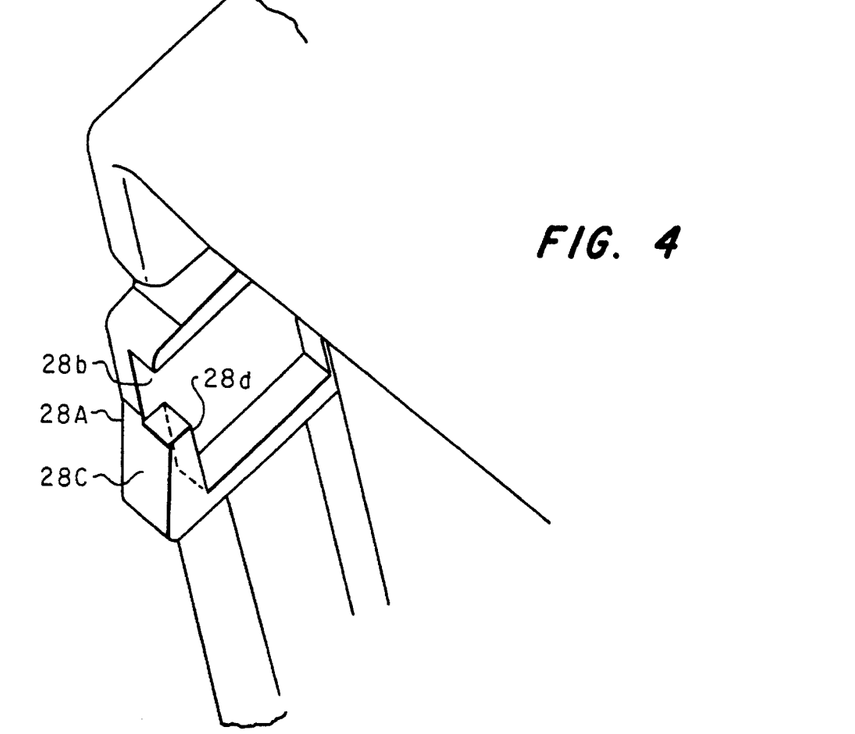
FIG. 4 is a schematic perspective view in which an engaging portion, which is provided at the cover of the notebook-type personal computer illustrated in FIG. 1, is expanded.

As can be seen in the expanded view of FIG. 4, the interior of the engaging portion 28A is formed as a substantial box-shape which is open. A substantially rectangular cut-out portion 28b, whose inner side is open, is formed in the wall of the engaging portion 28A which opposes the keyboard 20. An inclined surface 28C is formed at the center of pivoting side of the cut-out portion 28b so as to project toward the side opposing the keyboard 20. When the cover 16 is closed, the inclined surface 28C contacts the latch member 26A. A surface 28d at the opposite side of the portion at which the inclined surface 28C is provided engages with the latch member 26A. As the other engaging portion 28B is structured in the same way as the engaging portion 28A, description of the engaging portion 28B is omitted.

As illustrated in FIG. 2, engaging ribs 30A, 30B are formed at the underside of the keyboard 20 at positions which are slightly toward the center of pivoting side of the through holes 24A, 24B.

Figure 5:
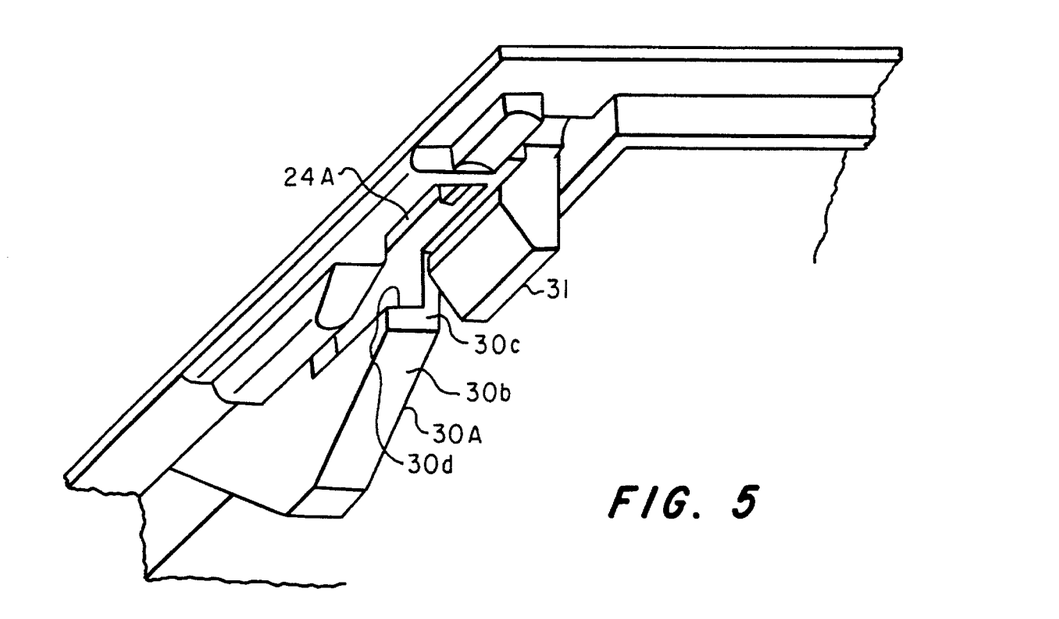
FIG. 5 is a schematic perspective view in which a vicinity of an engaging rib, which is provided at an underside of the keyboard of the notebook-type personal computer illustrated in FIG. 1, is expanded.

As can be seen in the expanded view of FIG. 5, an inclined surface 30b is formed in a portion of the engaging rib 30A at the pivoting edge side thereof so as to gradually project in a direction orthogonal to the surface of the keyboard 20 from the pivoting edge side to the center of pivoting side. A portion 30c, which has an L-shaped cross-section whose outer side is open toward the through hole 24A side of the inclined surface 30b, is formed in the engaging rib 30A. An opposing surface 30d of the portion 30c opposes the through hole 24A and engages with the latch member 26A. As the other engaging rib 30B is structured in the same manner as the engaging rib 30A, description of the engaging rib 30B is omitted.

The engaging ribs 30A, 30B, the latch members 26A, 26B, and other portions form a latch mechanism which will be described later. A stopper 31 is provided at the pivoting edge side of the engaging rib 30A at a portion located further inward than the through hole 24A. The stopper 31 restricts a compression coil spring, which will be described later, so that the compression coil spring does not protrude inwardly any more than necessary.

As illustrated in FIG. 2, a stand member 70, which is formed by a substantially rectangular plate spring member, is fixed to the underside of the keyboard 20 at the right edge portion thereof so as to be parallel to the keyboard and so that the edge portion at the center of pivoting side thereof (the lower side in FIG. 2) projects slightly toward the center of pivoting side. A vicinity of the edge portion of the stand member 70 at the center of pivoting side is covered along substantially the entire longitudinal direction length thereof by a member 72 having a substantially U-shaped cross section and formed of resin such as plastic or the like. As a result, when the keyboard 20 is opened and set upright, even if an operator releases hold of the keyboard 20, the keyboard 20 is maintained in its upright state due to the stand member 70. Further, the member 72, which is flexible during the opening and closing of the keyboard 20, slides on a surface 13 at the main body 12 side so that the opening and closing of the keyboard 20 is smooth and so that it is difficult to harm the surface 13.

Figure 6:
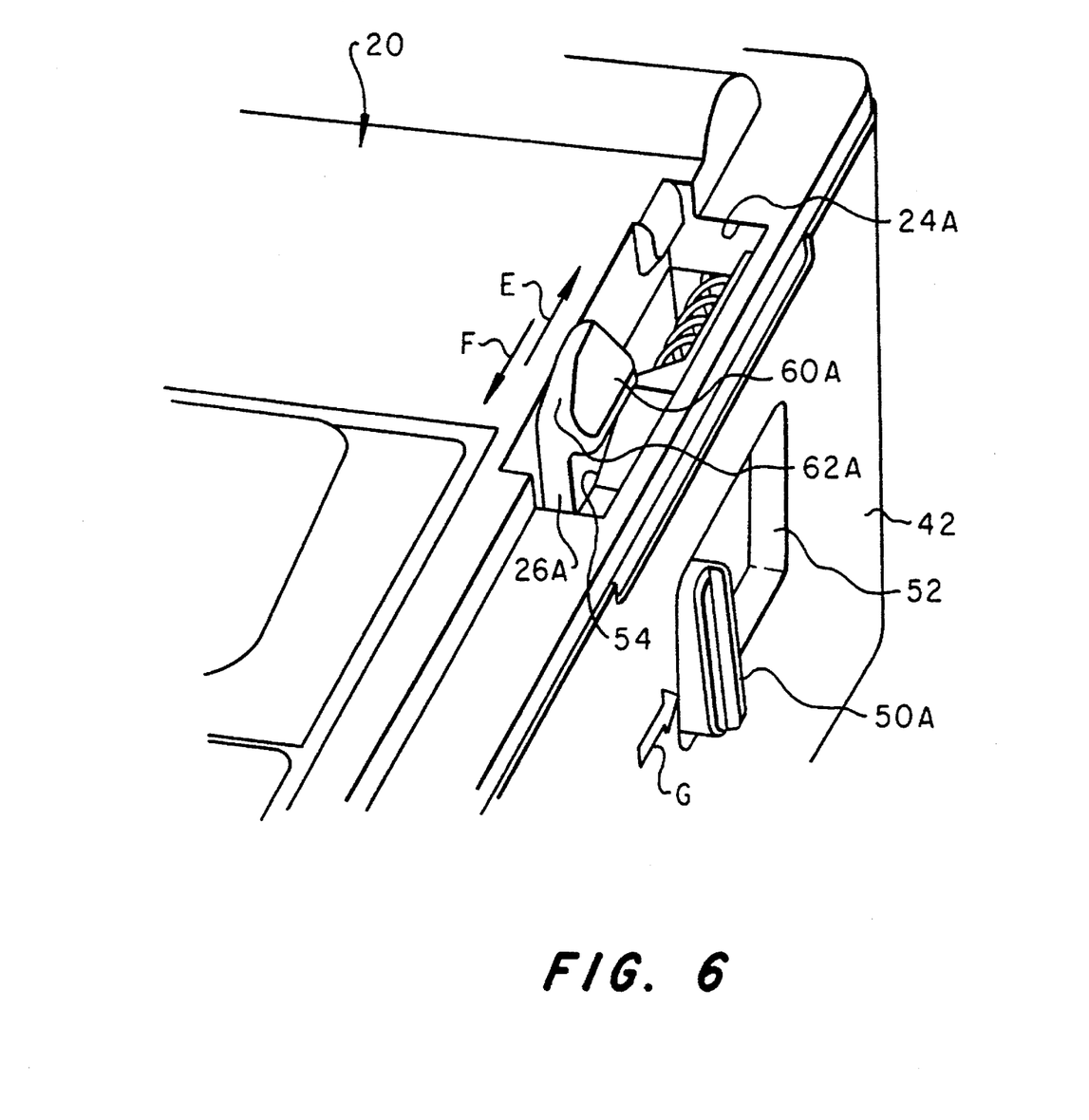
FIG. 6 is a schematic perspective view illustrating main portions of a latch mechanism at one side of a main body of the notebook-type personal computer illustrated in FIG. 1 in a state in which the cover is open.
Figure 7:
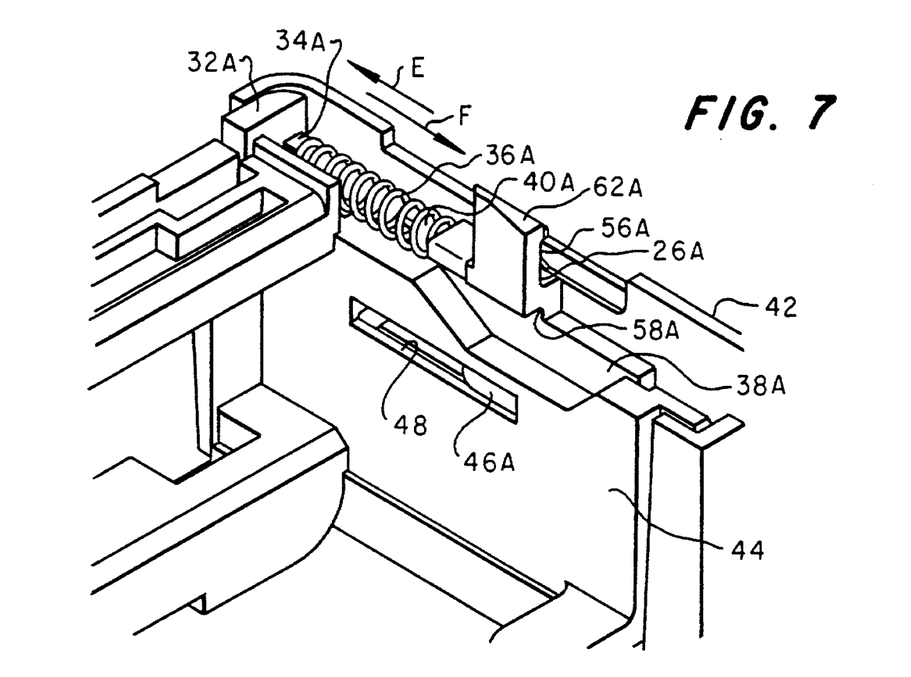
FIG. 7 is a schematic perspective view illustrating main portions of the latch mechanism at one side of the main body of the notebook-type personal computer illustrated in FIG. 1 in a state in which the keyboard is open.

FIG. 6 is an expanded view of main portions of the latch mechanism in a state in which the keyboard 20 is shut. FIG. 7 is an expanded view of main portions of the latch mechanism in a state in which the keyboard 20 is open.

Figure 8:
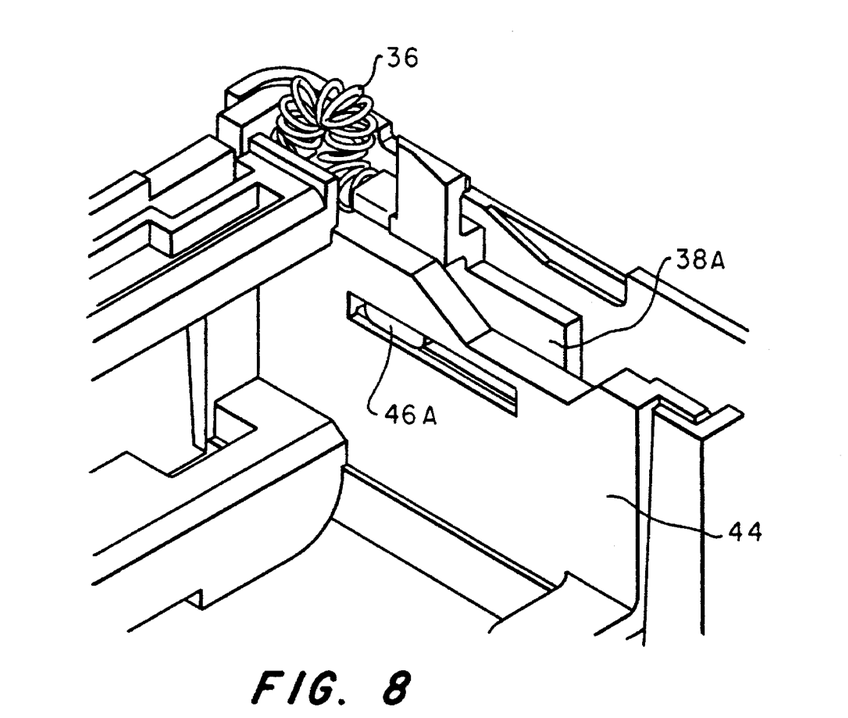
FIG. 8 is a schematic perspective view illustrating various portions corresponding to FIG. 7 when a latch member moves to a maximum release position.

In FIG. 7, a block 32A which forms a spring bearing is disposed substantially vertically at an inner surface of a corner portion of an edge of the main body 12. A protrusion 34A is provided integrally with an inner surface of the block 32A (see FIGS. 10A, 10B) so as to be oriented somewhat upwardly (i.e., at an upward angle). One end of a compression coil spring 36A (the left end in FIG. 7) is wound around the projection 34A. The other end of the compression coil spring 36A (the right end in FIG. 7) is wound around a projection 40A which projects from a slider 38A toward the block 32A. As illustrated in FIG. 7, the slider 38A is interposed between an outer wall 42 and an inner wall 44 of a side surface of the main body 12. A projection 46A is formed at the inner surface side of the slider 38A and is inserted into a sliding guide 48 formed in the inner wall 44 along the front-to-back direction of the main body 12 (the direction of arrows E and F in FIG. 7). The slider 38A is usually urged in the direction of arrow F in FIG. 7 by the compression coil spring 36A. As a result, the slider 38A can move reciprocally along the sliding guide 48 from the position at the right edge, as shown in FIG. 7, to the position at the left edge, as shown in Fig. 8. Further, a knob 50A such as that illustrated in FIG. 6 protrudes from the outer surface of the slider 38A. The knob 50A protrudes to the exterior of the main body 12 from an opening 52 formed in the outer wall 42 of the main body 12. The length of the opening 52 in the front-to-back direction is approximately the same length as the range of movement of the slider 38A.

As illustrated in FIG. 6, a groove 54 is formed in the keyboard 20. The groove 54 is formed at the rear side (i.e., at the front side of arrow F) of the through hole 24 and communicates therewith. The groove 54 permits a range of movement of the slider 38A which is slightly narrower than the range of movement of the slider 38A as illustrated in FIGS. 7 and 8. The range of movement of the slider 38A when the keyboard 20 is shut will be described later.

Figure 9:
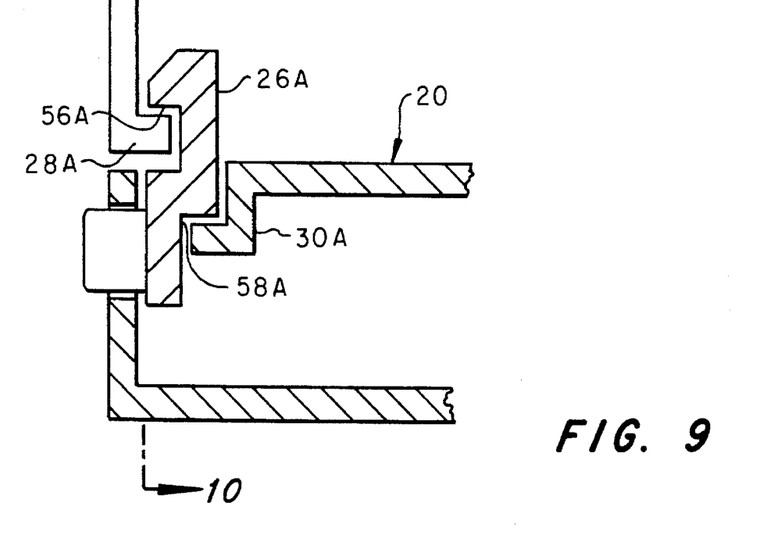
FIG. 9 is a schematic sectional view illustrating a structure of the latch mechanism.

The above-described latch member 26A serving as an engaging member is formed integrally with the upper portion of the slider 38A so as to project upwardly. As illustrated in FIG. 9, a first step portion 56A, which engages the engaging portion 28A provided on the cover 16, is formed at an outer surface side of the latch member 26A. A second step portion 58A, which engages the engaging rib 30A which protrudes from the underside of the keyboard 20, is formed at an inner surface side of the latch member 26A. As a result, when the cover 16 is in the closed state illustrated in FIG. 3, as illustrated in FIG. 9, the first step portion 56A of the latch member 26A engages the engaging portion 28A of the cover 16 from above, and the second step portion 58A engages the engaging rib 30A of the keyboard 20.

A first inclined surface 60A (see FIG. 6) is formed at the outer surface of the latch member 26A so as to correspond to the inclined surface 28c formed on the engaging portion 28A of the cover 16. Further, a second inclined surface 62A is formed at the front side in the direction of arrow F in FIGS. 6 and 7 of the latch member 26A so as to correspond to the inclined surface 30b formed at the engaging rib 30A of the keyboard 20.

As is evident from the above explanation, in the present invention, the latch mechanism serving as one of the engaging means for engaging the cover 16 and the keyboard 20 to the main body 12 is formed by: the compression coil spring 36A; the slider 38A and the latch member 26A provided integrally therewith, which are usually urged in the direction of arrow F in FIGS. 4 and 5 by the compression coil spring 36A; the engaging member 28A of the cover 16 which engages with the latch member 26A; and the engaging rib 30A of the keyboard 20.

As the latch mechanism serving as the engaging means at the other side of the main body 12 is structured in the same way, description thereof is omitted.

Next, operation of the present embodiment, which is structured as described above, will be explained with reference to FIGS. 10a and 10b.

Figure 3:
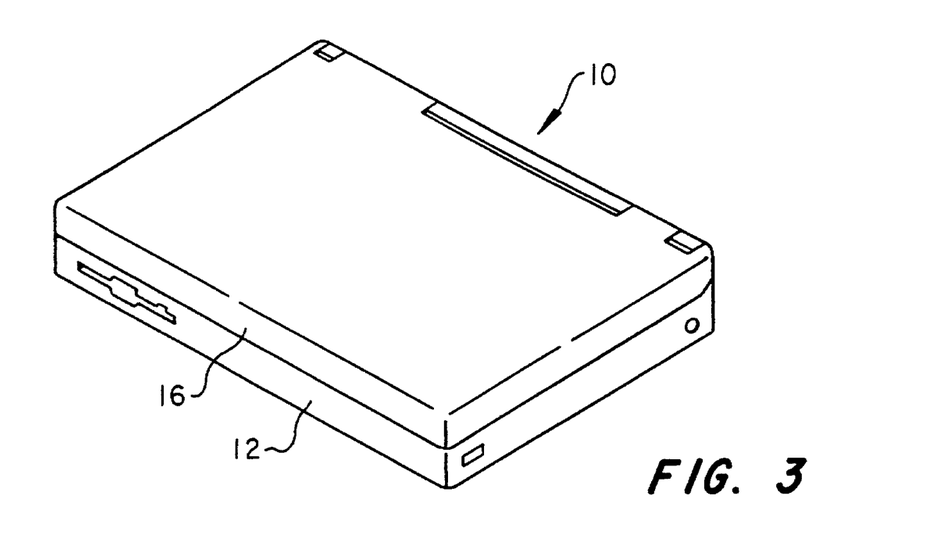
FIG. 3 is a perspective view illustrating a closed state of a cover of the notebook-type personal computer illustrated in FIG. 1.

When the cover 16 is closed as illustrated in FIG. 3, the latch member 26A is at the position illustrated by the solid lines in FIG. 10a (this position will be referred to hereinafter as the "first position"). In this state, the engaging portion 28A and the engaging rib 30A are engaged with the latch member 26A.

Figure 10A:
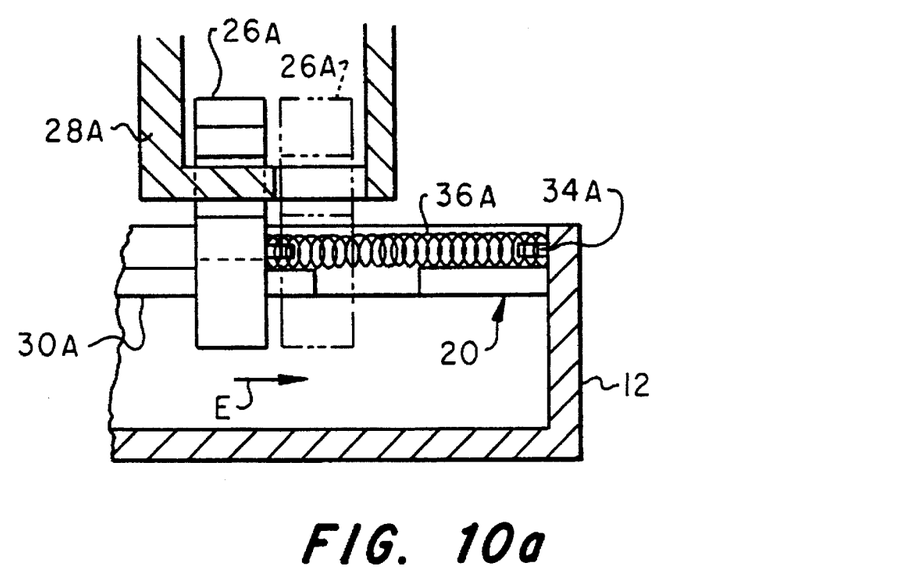
FIG. 10a is a view illustrating movement of the latch member from a first position to a third position.
Figure 10B:
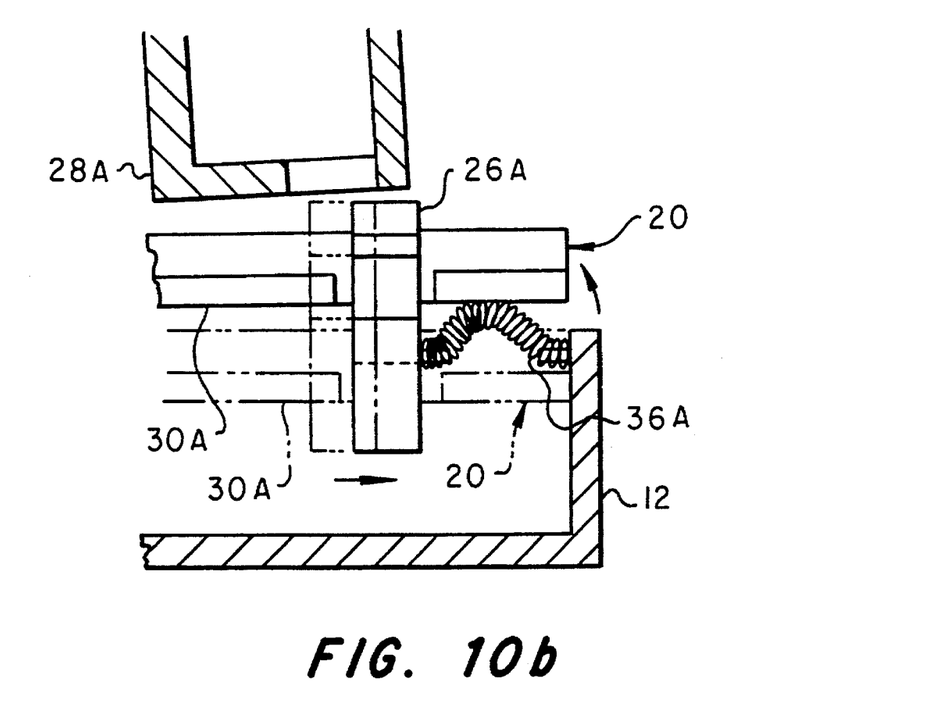
FIG. 10b is a view illustrating movement of the latch member from the third position to a second position.

Next, when an operator pulls the knob 50A in the direction of arrow E as illustrated by the large arrow G in FIG. 6, the slider 38A and the latch member 26A move in the direction of arrow E in FIG. 10a. When the latch member 26A reaches the position illustrated by the imaginary line in FIG. 10a (this position will be referred to as the "third position"), the engagement of the engaging portion 28A and the latch member 26A is canceled, and the cover 16 can be easily opened by an operator pivoting the cover 16 in the direction of arrow A in FIG. 1. At the third position, at least a portion of the latch member 26A corresponds to a portion of the groove 54 which communicates with the through hole 24A illustrated in FIG. 6.

At the third position, the keyboard 20 remains engaged with the main body 12 because the engaging rib 30A remains engaged with the latch member 26A.

When the cover 16 illustrated in FIG. 1 is open, if an operator pulls the knob 50A further in the direction of arrow E in FIG. 6, the slider 38A and the latch member 26A move further in the direction of arrow E in FIG. 10a. When the latch member 26A reaches the position illustrated by the solid line in FIG. 10b (this position will be referred to as the "second position"), the engagement of the engaging rib 30A and the latch member 26A is released. Simultaneously, the compression coil spring 36A is bent so as to protrude upwardly in a convex shape (see FIG. 8). The keyboard 20 is thereby pushed upward so as to be raised slightly above the main body 12 (i.e., the keyboard 20 pops up). At the second position, the latch member 26A is positioned so as to correspond to a portion of the through hole 24A illustrated in FIG. 6.

As a result, the keyboard 20 can be easily opened by an operator pivoting the keyboard 20 in the direction of arrow C in FIG. 2. When the keyboard 20 is opened, the operator releases the knob 50A, and the external force applied to the knob 50A is released. Therefore, the latch member 26A returns to the first position due to the urging force of the compression coil spring 36A.

In this state, when the operator pivots the keyboard 20 in the direction of arrow D in FIG. 2, the inclined surface 30b formed at the engaging rib 30A of the keyboard 20 abuts the second inclined surface 62A of the latch member 26A. When the operator pivots the keyboard 20 further in the direction of arrow D in FIG. 2, the second inclined surface 62A of the latch member 26A slides along the inclined surface of the keyboard 20. The latch member 26A thereby moves with the slider 38A to the second position against the urging force of the compression coil spring 36A. When the latch member 26A moves to the second position, the through hole 24A of the keyboard 20 and the latch member 26A oppose each other, and the upper edge portion of the latch member 26A protrudes from the through hole 24A as in the state illustrated in FIG. 10b. When the keyboard 20 is pivoted further in the direction of arrow D in FIG. 2 so as to be completely closed, the slider 38A together with the latch member 26A return along the groove 54 to the first position due to the urging force of the compression coil spring 36A (original position restoring force) such that the keyboard 20 and the main body 12 are in the engaged state illustrated in FIG. 10a. (However, at this time, the engaging portion 28A and the latch member 26A are not engaged.) This state is illustrated in FIG. 1.

When the operator pivots the cover 16 from the state illustrated in FIG. 1 in the direction of arrow B so as to close the cover 16, the inclined surface 28c of the cover 16 abuts the first inclined surface 60A of the latch member 26A. When the operator pivots the cover 16 further in the direction of arrow B in FIG. 1, the first inclined surface 60A of the latch member 26A slides along the inclined surface 28c of the cover 16. Accordingly, the latch member 26A together with the slider 38A move to the second position against the urging force of the compression coil spring 36A. When the latch member 26A reaches the second position, the cut-out portion 28b of the cover 16 and the latch member 26A oppose each other, and the upper edge portion of the latch member 26A enters into the cut-out portion 28b. When the cover 16 is pivoted even further in the direction of arrow B of FIG. 1 and is completely closed, the slider 38A together with the latch member 26A return along the groove 54 to the first position due to the urging force of the compression coil spring 36A (original position restoring force) such that the cover 16 and the keyboard 20 are in the engaged state illustrated in FIG. 10a. At this time, the cover 16 is completely closed as illustrated in FIG. 3.

The other latch mechanism functions in the same way in accordance with the opening and closing operations of the cover 16 and the keyboard 20.

As described above, in accordance with the present invention, the keyboard 20 and the cover 16 can be engaged with and released from the main body 12 by a single latch mechanism. Further, the keyboard 20 is urged so as to be pivoted in the opening direction by the deformation of the compression coil spring 36A which forms a portion of the latch mechanism. Therefore, the number of parts and the space needed can be greatly reduced. Moreover, if the operator pulls the knob 50A slightly, the latch member 26A moves together with the slider 38A from the first position to the third position and only the engaged state of the main body 12 and the cover 16 is released. If the operator pulls the knob 50A hard, the latch member 26A moves together with the slider 38A from the first position to the second position so that the engaged state of the main body 12 and the keyboard 20 is also released. Therefore, by the operator merely pulling the knob 50A, the engaged state of the main body 12 and the cover 16 or the engaged state of the main body 12 and the keyboard 20 can be easily released. Because the releasing of the engaged states can be effected separately at one side and the other side of the main body 12, the latches can be released with only one hand, and it suffices that the opening and closing of the keyboard 20 and the cover 16 are effected by pivoting operations only. Accordingly, workability does not deteriorate.

The above explanation of the present embodiment described a case in which the mechanism reaches the state in FIG. 2 from the state in FIG. 3 via the state in FIG. 1. However, the engaged state of the cover 16 and the keyboard 20 can be released directly from the state in FIG. 3 so that the keyboard 20 can be opened right away.

At the third position, it is possible to open only the cover 16 while the keyboard 20 remains in its closed state. Therefore, at the second position, the keyboard 20 can also be opened without interfering with the usual operation of the notebook-type personal computer 10. As a result, devices such as a memory, an expansion board and the like for expanding functions can be freely installed via various unillustrated interfaces within the main body 12, or can be exchanged. Alternatively, a fixed device can be fixed within the main body 12.

The above explanation describes a case in which the compression coil spring is used as an elastic member. However, the present invention is not limited to the same. It suffices to provide a member which usually urges the slider 38A on which the latch member 26A is provided to the engaging position, and which deforms at the releasing position so as to cause the keyboard 20 to pop up in the direction of opening. Plate springs may be used, or other elastic members made of resin or the like may be used.

The structure for engaging and releasing the latch member 26A is not limited to the structure described in the above embodiment. Any structure suffices in which the engagement of the cover 16 and the keyboard 20 with the main body 12 is canceled when the latch member 26A moves from the first position to the second position, and in which only the engaged state of the main body 12 and the cover 16 is released when the latch member 26A moves from the first position to the third position.

In addition to notebook-type personal computers, the present invention is applicable to small computers such as lap-top type personal computers and the like. The present invention can be applied to any structure of any purpose having a cover as long as the structure has a cover which can be opened and closed or has a cover and an intermediate cover which can be opened and closed.

As described above, the present invention provides superior effects not found in the conventional art in that the number of parts can be reduced, efficient utilization of space can be improved, and therefore, costs can be reduced, without any deterioration of workability during the opening and closing of the cover.

While the invention has been particularly shown and described with reference to a preferred embodiment, it will be understood by those skilled in the art that various changes in form and detail may be made therein without departing from the spirit and scope of the invention.

We claim:

1. A structure having a cover, said structure having a main body and a cover which is provided at said main body so as to pivot around an edge portion of said cover so as to be openable and closable, said structure having a cover comprising:

an engaging member movable between an engaging position, at which said engaging member engages said cover to said main body, and a releasing position, at which an engaged state of said cover and said main body is released; and an elastic member usually urging said engaging member from said releasing position toward said engaging position, and deforming in accordance with movement of said engaging member so as to urge said cover in an opening direction when said engaging member moves to said releasing position.

2. A structure having a cover, said structure comprising:

a main body;

a cover being provided at said main body so as to pivot around an end portion of said cover so as to be openable and closable:

an intermediate cover being provided at said main body so as to pivot around an end portion of said intermediate cover so as to be openable and closable; and engaging means for engaging both a region of said cover, which is nearer to a pivoting edge of said cover than to a center of pivoting of said cover, and a region of said intermediate cover, which is nearer to a pivoting edge of said intermediate cover than to a center of pivoting of said intermediate cover, to said main body.

3. A structure having a cover according to claim 2, wherein said engaging means includes an engaging member provided at said main body, said engaging member being movable from a first position, at which said cover and said intermediate cover are engaged to said main body, to a second position, at which an engaged state of said cover and said intermediate cover to said main body is released, said engaging member releasing only an engaged state of said main body and said cover at a third position which is between said first position and said second position.

4. A structure having a cover according to claim 3, further comprising an elastic member usually urging said engaging member from said second or third position toward said first position, and deforming in accordance with the movement of said engaging member so as to urge said intermediate cover in an opening direction when said engaging member moves to said second position.

5. A personal computer having a cover, said personal computer having a main body and a cover which is provided at said main body so as to pivot around an edge portion of said cover so as to be openable and closable, said personal computer having a cover comprising:

an engaging member movable between an engaging position, at which said engaging member engages said cover to said main body, and a releasing position, at which an engaged state of said cover and said main body is released; and an elastic member usually urging said engaging member from said releasing position toward said engaging position, and deforming in accordance with movement of said engaging member so as to urge said cover in an opening direction when said engaging member moves to said releasing position.

6. A personal computer having a cover, said personal computer comprising:

a main body;

a cover being provided at said main body so as to pivot around an end portion of said cover so as to be openable and closable:

an intermediate cover being provided at said main body so as to pivot around an end portion of said intermediate cover so as to be openable and closable; and engaging means for engaging both a region of said cover, which is nearer to a pivoting edge of said cover than to a center of pivoting of said cover, and a region of said intermediate cover, which is nearer to a pivoting edge of said intermediate cover than to a center of pivoting of said intermediate cover, to said main body.

7. A personal computer having a cover according to claim 6, wherein said engaging means includes an engaging member provided at said main body, said engaging member being movable from a first position, at which said cover and said intermediate cover are engaged to said main body, to a second position, at which an engaged state of said cover and said intermediate cover to said main body is released, said engaging member releasing only an engaged state of said main body and said cover at a third position which is between said first position and said second position.

8. A personal computer having a cover according to claim 7, further comprising an elastic member usually urging said engaging member from said second or third position toward said first position, and deforming in accordance with the movement of said engaging member so as to urge said intermediate cover in an opening direction when said engaging member moves to said second position.

9. A personal computer having a cover according to claim 6, wherein said personal computer is a lap-top computer.

* * * * *